United States Patent [19]

Kumagai

[11] Patent Number: 5,636,196
[45] Date of Patent: Jun. 3, 1997

[54] OPTICAL DISC APPARATUS WITH SELECTIVELY SHIFTABLE SEEK OPERATION CAPTURE RANGE

[75] Inventor: Eiji Kumagai, Kanagawa, Japan

[73] Assignee: Sony Corporation, Tokyo, Japan

[21] Appl. No.: 429,678

[22] Filed: Apr. 27, 1995

[30] Foreign Application Priority Data

Apr. 28, 1994 [JP] Japan .................................. 6-114545

[51] Int. Cl.$^6$ .................................. G11B 20/14; G11B 7/00
[52] U.S. Cl. .................................. 369/124; 369/50; 369/54; 369/44.26
[58] Field of Search .................................. 369/50, 59, 47, 369/32, 111, 240, 48, 54, 124, 44.26

[56] References Cited

U.S. PATENT DOCUMENTS

| | | | |
|---|---|---|---|
| 4,841,511 | 6/1989 | Suzuki et al. | 369/50 |
| 5,161,142 | 11/1992 | Okano | 369/50 |
| 5,170,386 | 12/1992 | Tateishi | 369/50 |
| 5,315,571 | 5/1994 | Maeda et al. | 369/50 |
| 5,444,687 | 8/1995 | Okumura | 369/50 |

*Primary Examiner*—Georgia Y. Epps
*Assistant Examiner*—Kim-Kwok Chu
*Attorney, Agent, or Firm*—Limbach & Limbach, L.L.P.

[57] ABSTRACT

An optical disc apparatus which expands the PLL pulling frequency range, and shortens the time required to start PLL pulling, by a simple construction. The linear velocity detection signal $V_{e2}$ which is sent from the linear velocity detecting means 11 is added to the controlling voltage $V_{e1}$ at the adding means 10, and sent to the voltage controlled oscillator 9 of the PLL circuit 6.

4 Claims, 4 Drawing Sheets

OPTICAL DISC APPARATUS WITH SELECTIVELY SHIFTABLE SEEK OPERATION CAPTURE RANGE

BACKGROUND OF THE INVENTION

1. Field of the Invention

This invention relates to an optical disc apparatus of CLV (Constant Linear Velocity) type which reproduces signals from an optical disc rotated with a constant linear velocity.

2. Description of the Related Art

Heretofore, there has been an optical disc apparatus of CLV (Constant Linear Velocity) system which reproduces data, in which a linear velocity at the data reproducing position is held constant, for the inner and the outer peripheries of the disc. In the optical disc apparatus, to read a data of the disc, at first, an optical pick-up is moved to the vicinity of the data reading position of the disc by rough seeking. Next, a laser light is emitted from the optical pick-up toward the disc, and a signal which depends on the reflected light is detected. Subsequently, a clock which has been synchronized with the reproduced signal is generated in a phase locked loop (PLL), data recording position (address) information is read, and more detailed precise seeking is started.

More specifically, when the disc has been rotation-controlled and the linear velocity on the signal detecting position has reached to the predetermined linear velocity, the frequency of the detected signal reaches into the range of frequency pulling of PLL (hereinafter, referred as the "capture range"), and pulling of the PLL into the detected signal is started.

In the case where the linear velocity of the signal detecting position of the disc is controlled by rotation controlling, the time for the linear velocity to reach the predetermined linear velocity at which PLL can be pulled into the detected signal occasionally takes longer than the time required to reach the optical pick-up to the vicinity of the predetermined recording position area of the disc. In this case, even if the optical pick-up has reached the predetermined recording area on the disc, the PLL can not be pulled into the detected signal, until the linear velocity of the signal detecting position reaches the predetermined linear velocity. Therefore, there has been the problem that time is taken from the moment at which the optical pick-up has reached the predetermined recording area of the disc until the moment at which the precision seeking is started.

SUMMARY OF THE INVENTION

In view of the foregoing, an object of this invention is to provide an optical disc apparatus which is possible to expand the PLL pulling frequency range by a simple configuration, and to shorten the time needed for PLL pulling.

The foregoing object and other objects of the invention have been achieved by the provision of an optical disc apparatus 1 for reproducing an information data recorded on an optical disc 2 which is rotationally driven with a constant linear velocity, the optical disc apparatus 1 comprising: optical pick-up means 4 for reproducing the information data from the optical disc 2; signal detecting means 5 for amplifying and also binarizing output signals from the optical pick-up means 4, and for outputting the resulted signal as a reproduction signal ($V_i$); linear velocity detecting means 11 for detecting the linear velocity ($V_1$) of the optical disc 2 from the reproduction signal ($V_i$), and for outputting a linear velocity detection signal ($V_{e2}$) corresponding to the difference against a predetermined linear velocity ($V_0$); and clock generating means 6 which is composed of a phase locked loop configuration having a phase comparator 7, a loop filter 8, and a voltage controlled oscillator 9, in which the linear velocity detection signal ($V_{e2}$) from the linear velocity detecting means 11 is added to a controlling voltage ($V_{e1}$) of the voltage controlled oscillator 9, so that the clock signal ($V_c$) which is synchronized with the reproduction signal ($V_i$) is generated.

The linear velocity detection signal ($V_{e2}$) which is sent from the linear velocity detecting means 11 is added to the controlling voltage ($V_{e1}$), and then sent to the voltage controlled oscillator 9. As a result, the PLL pulling frequency range of the PLL circuit 6 is expanded by the magnitude of the detecting range of the linear velocity ($V_1$).

According to this invention, the linear velocity detecting signal corresponding to the difference between the linear velocity of the optical disc and the constant linear velocity, which is sent from the linear velocity detecting means, is added to the controlling voltage of the voltage controlled oscillator, which generates the clock signal, of the phase locked loop, so that the pulling frequency range of phase locked loop can be expanded by the magnitude of the detecting range of the linear velocity.

The nature, principle and utility of the invention will become more apparent from the following detailed description when read in conjunction with the accompanying drawings in which like parts are designated by like reference numerals or characters.

DETAILED DESCRIPTION OF THE EMBODIMENT

Figure 1:
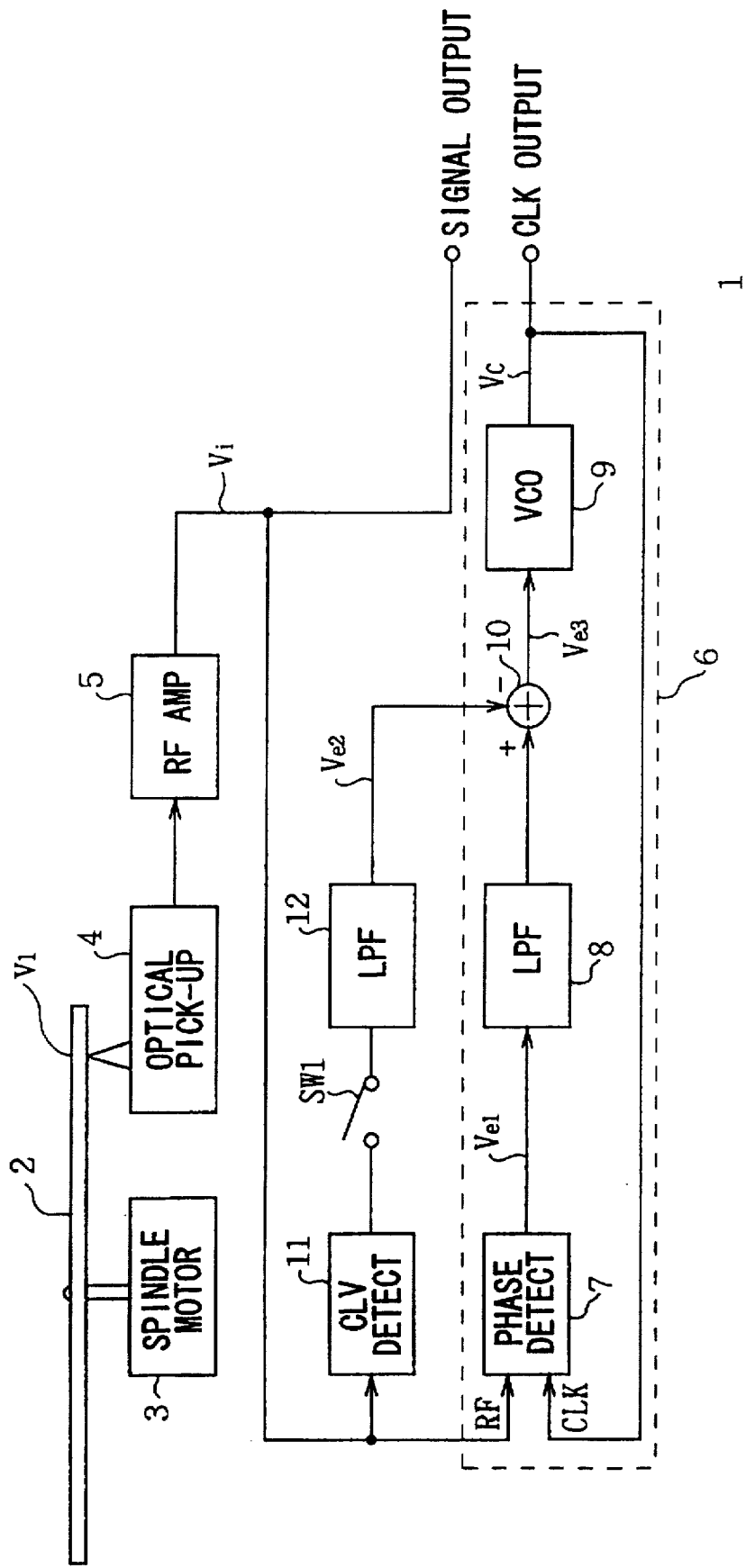
FIG. 1 is a block diagram showing the general construction of an embodiment of the optical disc apparatus according to this invention.

Preferred embodiments of this invention will be described with reference to the accompanying drawings:

Referring to FIG. 1, the reference number 1 generally designates an optical disc apparatus of a CLV system. The optical disc apparatus 1 rotates a loaded disk 2 with a spindle motor 3, and reads a record data of the disc 2 by an optical pick-up 4 at the constant linear velocity $V_0$. The optical pick-up 4 emits a light beam onto the predetermined recording area of the recording data of the disc 2, and receives the reflected light which is obtained from the disc 2, and then sends the reproducing signal obtained as the result to an RF amplifier 5. The recording data on the disc 2 which has been read by the optical pick-up 4 is amplified by the RF amplifier 5 and also binarized, and then outputted as the RF signal $V_i$.

The RF signal $V_i$ outputted from the RF amplifier 5 is sent to a PLL circuit 6 so as to be synchronized with the reference clock $V_c$ which is oscillated from the voltage controlled oscillator (VCO) 9. As to the PLL circuit 6, phases and frequencies of the RF signal $V_i$ and the reference clock $V_c$ are compared in a phase detector 7, and an error voltage $V_{e1}$ obtained as the result is sent to a low pass filter 8. The error voltage $V_{e1}$ of which high frequency component has been eliminated by the low pass filter 8 is sent to an adder 10.

A CLV detector 11 is also connected to the PLL circuit 6 via a switch SW1, the CLV detector 11 outputting an error voltage $V_{e2}$ which is in response to the difference between the linear velocity $v_1$ on the predetermined recording area of the disc 2 and the linear velocity $v_0$. When the optical disc apparatus 1 seeks the address of the recording data, the CLV detector 11 is connected to the PLL circuit 6 via the adder 10, by closing the switch SW1.

Figure 2:
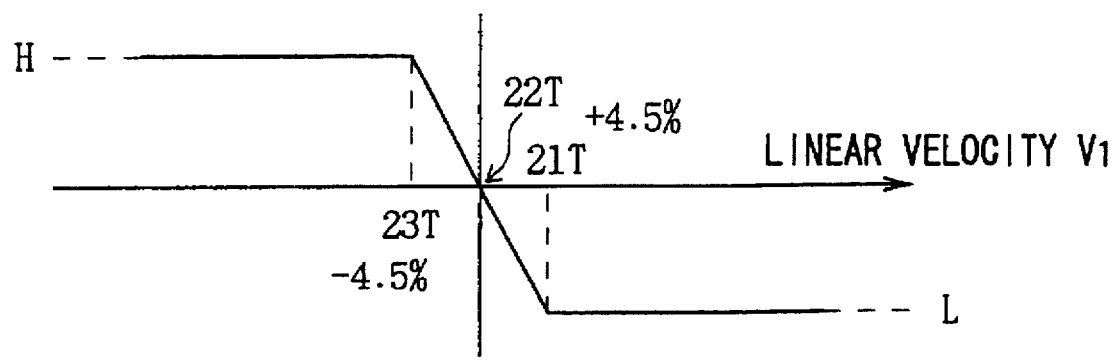
FIG. 2 is an output waveform chart showing the detection output of the CLV detector versus the linear velocity.

When the switch SW1 is closed, the CLV detector 11 sends the error voltage $V_{e2}$ which is based on the inputted RF signal $V_i$ to the low pass filter 12, via the switch SW1. This RF signal $V_i$ is read at the data transfer rate which is in direct proportion to the linear velocity $v_1$ in the data reading position. The CLV detector 11 outputs the output signal of high level, low level, or zero level based on the frequency of the frame synchronizing signal of twenty-four bit patterns included in the RF signal $V_i$. The frame synchronizing signal is the frequency of 22T when the optical disc is rotated at the predetermined linear velocity. Here, "T" is the frequency of the reference clock of signal format of the optical disc. The error voltage $V_{e2}$ of low level "L" when the frequency of the frame synchronizing signal is 21T or less, zero level "0" when it is 22T, or high level "H" when it is 23T or more, is outputted. Besides, in the case where the frequency of the frame synchronizing signal is between 21T and 23T, inclusive, the output obtained linearly varies by the noise and the jitter of the RF signal $V_i$ (FIG. 2).

More specifically, the output level of the error voltage $V_{e2}$ which is outputted from the CLV detector 11 becomes to low level "L", in the case where the linear velocity $v_1$ of the data reading position on the disc 2 is faster compared to the linear velocity $v_0$. As contrasted to this, when the linear velocity $v_1$ of the data reading position on the disc 2 is lower compared to the linear velocity $v_0$, the output of the CLV detector 11 becomes to high level "H".

At the adder 10, the error voltage $V_{e2}$ from the CLV detector 11 is reversed its polarity, and then added to the error voltage $V_{e1}$ of the phase detector 7. The resulted composite output ($V_{e1}-V_{e2}$) is sent to the voltage controlled oscillator 9, as the controlling voltage $V_{e3}$ for the voltage controlled oscillator 9. At the voltage controlled oscillator 9, the reference clock $V_c$ having the oscillation frequency which is in response to the inputted controlling voltage $V_{e3}$ is outputted, and then it is fed back to the phase detector 7.

More specifically, when the optical pick-up 4 has been moved the predetermined distance or more on the disc 2, the RF signal $V_i$ and the reference clock $V_c$ are synchronized renewedly in the PLL circuit 6. Hereupon, in the case where the linear velocity $v_1$ of the data reading position is faster in comparison with the linear velocity $v_0$, the controlling voltage $V_{e3}$ which is sent to the voltage controlled oscillator 9 is shifted to positive side by the magnitude of the error voltage $V_{e2}$. On the contrary, in the case where the linear velocity $v_1$ of the data reading position on the disc 2 is slower in comparison with the linear velocity $v_0$, the controlling voltage $V_{e3}$ which is sent to the voltage controlled oscillator 9 is shifted to negative side by the magnitude of the error voltage $V_{e2}$. Hereby, in the case where the linear velocity $v_1$ is faster in comparison with the linear velocity $v_0$, a capture range of the PLL circuit 6 is displaced toward the high frequency side. On the contrary, in the case where the linear velocity $v_1$ is slower in comparison with the linear velocity $v_0$, the capture range of the PLL circuit 6 is displaced toward the low frequency side, so that the capture range of the PLL pulling frequency is expanded apparently.

In the above construction, when the disc 2 which has been loaded into the optical disc apparatus 1 of CLV system is rotated by the spindle motor 3, the optical pick-up 4 is then moved onto the predetermined data recording area of the disc 2, and reading of the record data is started. The record data which has been read by the optical pick-up 4 is sent to the PLL circuit 6 as the RF signal $V_i$ via the RF amplifier 5. In the PLL circuit 6, at first, phases and frequencies of the RF signal $V_i$ and the reference clock $V_c$ which is oscillated from the voltage controlled oscillator 9 are compared at the phase detector 7. The error voltage $V_{e1}$ which is in response to the phase difference and the frequency difference between the RF signal $V_i$ and the reference clock $V_c$ is sent from the phase detector 7 to the voltage controlled oscillator 9 via the low pass filter 8.

Figure 3A:
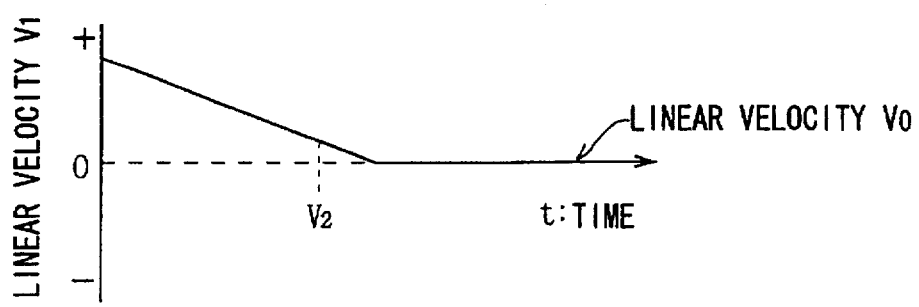
FIGS. 3A to 3D are signal waveform charts showing the linear velocity of the disc and the error voltage.
Figure 3B:
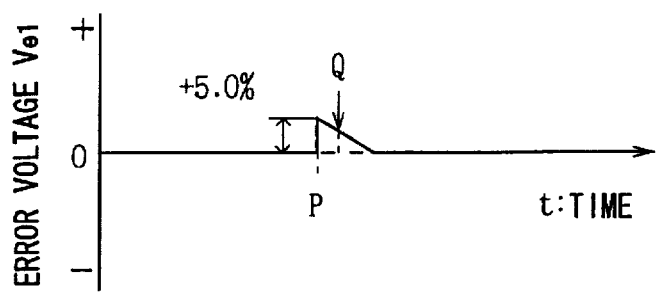

In the case where the optical pick-up 4 is moved from the inner periphery area of the disc 2 to the outer periphery area, in the optical disc apparatus 1 of CLV system, the number of revolution of the spindle motor 3 is gradually lowered, and the linear velocity of the data reading position is rotation-controlled so as to be the constant linear velocity $v_0$. FIG. 3A shows the relation between the linear velocity $v_1$ and the time t. Conventionally, the specific velocity at which the PLL pulling of RF signal $V_i$ starts is "$V_2$", and the time when the linear velocity $v_1$ reaches to the specific velocity $v_2$ is "P". The capture range of the PLL circuit 6 is ±5.0[%]. FIG. 3B shows the relation between the error voltage $V_{e1}$ which is outputted from the phase detector 7, and the time t. Until the time P when the PLL pulling starts, the PLL circuit 6 oscillates at the self-running frequency of the VCO 9 so that the error voltage $V_{e1}$ is "0". At the time Q, the precise seeking is terminated.

Figure 3C:
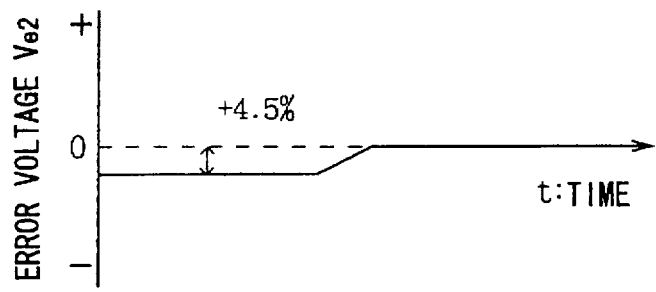

At the same time, the optical disc apparatus 1 closes the switch SW1, thereby the error voltage $V_{e2}$ outputted from the CLV detector 11 is sent to the adder 10 via the low pass filter 12. In this case, since the linear velocity of the outer periphery of the disc 2 is faster than the linear velocity of the inner periphery, the error voltage $V_{e2}$ of low-level "L" is sent from the CLV detector 11 to the adder 10 via the low pass filter 12. FIG. 3C shows the relation between the error voltage $V_{e2}$ and the time t. The dynamic range of the CLV detector 11 is ±4.5[%].

Figure 3D:
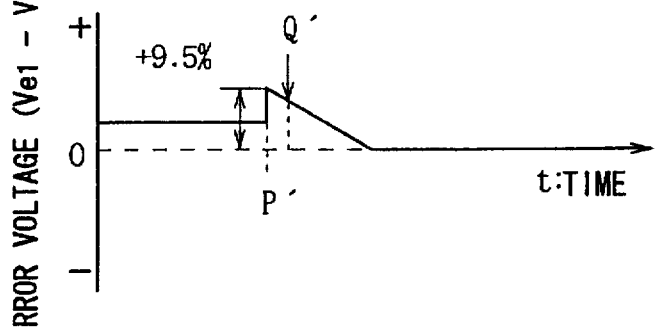

In the adder 10, the error voltage $V_{e2}$ of the CLV detector 11 is reversed, and added to the error voltage $V_{e1}$ of the phase detector 7 (FIG. 3B). The resulted controlling voltage $V_{e3}$ (FIG. 3D) is sent to the voltage controlled oscillator 9. Hereby the controlling voltage $V_{e3}$ is able to expand the apparent capture range of PLL toward high frequency side by about +4.5[%], by the error voltage $V_{e2}$. Thus, in comparison with the previous aspect that PLL pulling of the RF signal $V_i$ has been started at the time P when the linear velocity $v_1$ of the data recording position has reached to the predetermined linear velocity $v_2$, PLL pulling of the RF signal $V_i$ can be started at the earlier time PL'.

When pulling of the RF reproducing signal $V_i$ into the PLL has been started, from the same time P' precise seeking of the data address is started, and precise seeking of the address is completed at the time Q'. Since the time interval between the precise seeking starting time P' and the seeking completion time Q' not differ from the conventional time interval between the time P and the time Q, precise seeking of the data address can be earlier completed by about 40[msec], that is the interval between the conventional time Q and the time Q', by virtue of the earlier starting time of PLL pulling.

According to the above construction, in the optical disc apparatus 1 of CLV system, when precise seeking of the address on the disc 2 on which the data has been recorded is performed, the error voltage $V_{e2}$ from the CLV detector 11 is added to the error voltage $V_{e1}$ of the phase detector 7 and then sent to the voltage controlled oscillator 9 as the controlling voltage $V_{e3}$, so that the capture range of the PLL circuit 6 is displaced. As to the capture range, the dynamic range of ±4.5[%] of the CLV detector 11 is added to the inherent capture range of ±5.0[%] of the PLL circuit 6, so that the capture range of ±9.5[%] is obtained as a whole. Consequently, pulling of the RF signal $V_i$ of PLL is performed earlier than the ordinary, so that precise seeking of the desired record data address on the disc 2 can be earlier started.

Figure 5:
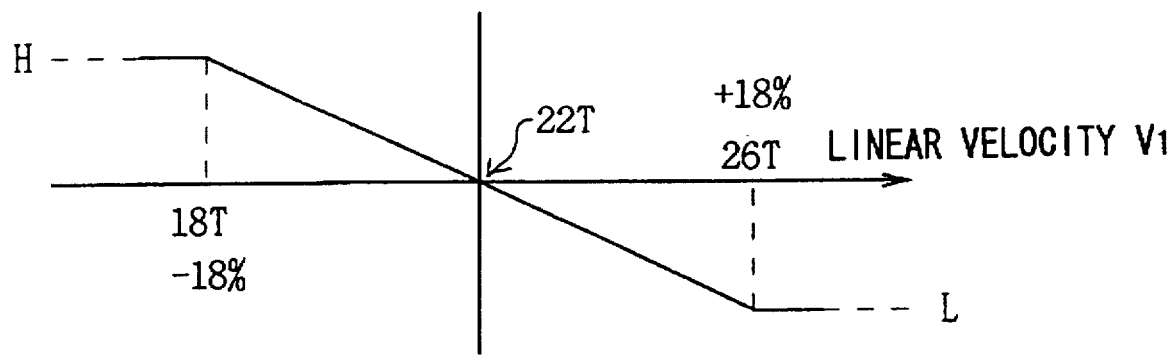
FIG. 5 is an output waveform chart showing an example of modification of the detection output of the CLV detector versus the linear velocity.
Figure 4:
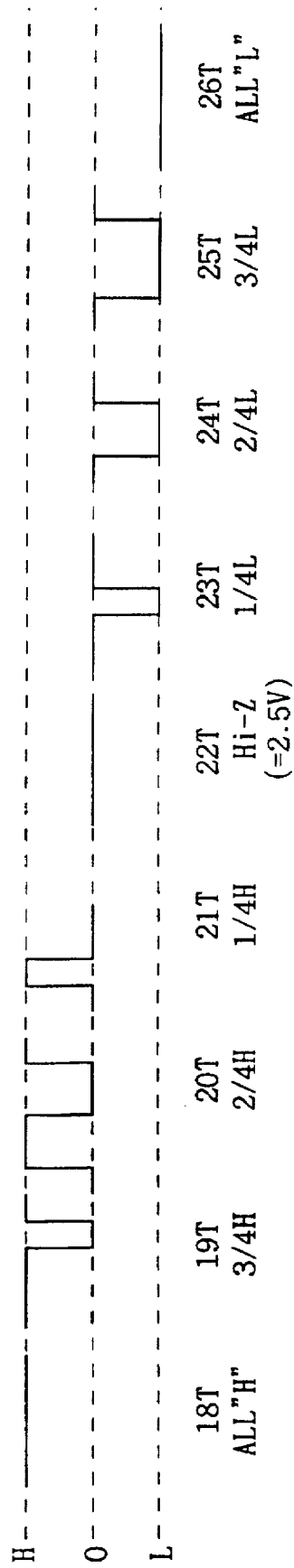
FIG. 4 is an output waveform chart showing the CLV detection output of the case where the cycle of the frame synchronizing signal is divided into four.

In the above embodiment, the case where the level of the error voltage $V_{e2}$ which is outputted from the CLV detector 11 is set in such a way as to become low level "L" when the frequency of the frame synchronizing signal is 21T or less, zero level "0" when it is 22T, or high level "H" when it is 23T or more has been described. However, this invention is not only limited to this, but for example, as shown in FIG. 4, by dividing the cycle of the frame synchronizing signal into four and then performing PWM (pulse width modulation) processing, linear detection of the linear velocity become possible in the area between 18T and 26T (FIG. 5). As a result, CLV detecting dynamic range of ±18[%], which is four times the range between 21T and 23T, can be obtained. Adding this to the inherent capture range of the PLL circuit 6 of ±5.0[%], it becomes possible to perform PLL pulling with the frequency range of the capture range of ±23[%] as a whole. Whereby, the time required to start seeking of the desired address can be further shortened.

While there has been described in connection with the preferred embodiments of the invention, it will be obvious to those skilled in the art that various changes and modifications may be aimed, therefore, to cover in the appended claims all such changes and modifications as fall within the true spirit and scope of the invention.

What is claimed is:

1. An optical disc apparatus for reproducing an information data recorded on an optical disc which is rotationally driven with a constant linear velocity, comprising:

optical pick-up means for reproducing said information data from said optical disc;

signal detecting means for amplifying and also binarizing output signals from the optical pick-up means, and for outputting a resulted signal as a reproduction signal;

linear velocity detecting means for detecting the linear velocity of said optical disc from said reproduction signal, and for outputting a linear velocity detection signal corresponding to an error against a predetermined linear velocity; and clock generating means for generating a clock signal that is synchronous with said reproduction signal, the clock generating means having a phase locked loop configuration including a phase comparator that compares a phase of the clock signal generated by the clock generating means with a phase of said reproduction signal to generate a phase difference signal, a loop filter that filters said phase difference signal to generate a filtered phase difference signal, and a voltage controlled oscillator that generates the clock signal in response to the filtered phase difference signal, the clock generating means further including linear velocity detecting means which selectively generates a linear velocity detection signal, wherein the linear velocity detection signal, when selected to be generated, is combined with the filtered phase difference signal provided to control said voltage controlled oscillator, so that the clock signal which is synchronized with said reproduction signal is generated.

2. The optical disc apparatus according to claim 1, wherein when the linear velocity of said optical disc detected by said reproduction signal is equals to said predetermined linear velocity, said velocity detecting means outputs said linear velocity detection signal having a first predetermined value, when said linear velocity is detected to be greater than said predetermined lineal velocity, said velocity detecting means outputs said linear velocity detection signal having a second predetermined value, and when said linear velocity is detected to be less than said predetermined linear velocity, said linear velocity detecting means outputs said linear velocity detection signals having a third predetermined value.

3. The optical disc apparatus according to claim 1, wherein said linear velocity detecting means outputs said linear velocity detection signal according to the result of the comparison the linear velocity of said optical disc detected from said reproduction signal with said predetermined linear velocity.

4. The optical disc apparatus according to claim 1, claim 2, or claim 3, wherein said linear velocity detection signal from said linear velocity detecting means is selected to be added to the controlling voltage of said voltage controlled oscillator only during a seek operation in which said optical pick-up means is moved in a radial direction of said optical disc by at least a predetermined value.

* * * * *

UNITED STATES PATENT AND TRADEMARK OFFICE
CERTIFICATE OF CORRECTION

PATENT NO. : 5,636,196
DATED : June 3, 1997
INVENTOR(S) : Eiji Kumagai

It is certified that error appears in the above-indentified patent and that said Letters Patent is hereby corrected as shown below:

At Col. 6, line 27, please delete "equals" and insert in place thereof --equal--.

Signed and Sealed this

Second Day of September, 1997

Attest:

BRUCE LEHMAN

Attesting Officer

Commissioner of Patents and Trademarks